United States Patent
Kondo et al.

(10) Patent No.: US 6,730,990 B2
(45) Date of Patent: May 4, 2004

(54) MOUNTABLE MICROSTRUCTURE AND OPTICAL TRANSMISSION APPARATUS

(75) Inventors: Takayuki Kondo, Suwa (JP); Tatsuya Shimoda, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/895,825

(22) Filed: Jun. 29, 2001

(65) Prior Publication Data

US 2002/0063310 A1 May 30, 2002

(30) Foreign Application Priority Data

Jun. 30, 2000 (JP) ........................................ 2000-199984
Jun. 29, 2001 (JP) ........................................ 2001-197802

(51) Int. Cl.$^7$ ............................ H01L 29/06; H01L 27/15; H01L 31/12; H01L 33/00

(52) U.S. Cl. .................... 257/623; 257/625; 257/80; 257/81; 257/82; 257/12; 438/456; 216/99

(58) Field of Search .......................... 257/625, 80–84, 257/93, 99, 184, 187, 195, 200–201, 278, 458, 466, 623, 10, 12–15; 438/455–456; 216/99

(56) References Cited

U.S. PATENT DOCUMENTS 4,339,870 A * 7/1982 Ball et al. .................. 257/623
4,949,148 A * 8/1990 Bartelink ................... 257/712
5,141,878 A * 8/1992 Benton et al. .............. 257/461

(List continued on next page.)

FOREIGN PATENT DOCUMENTS

| JP | 61182240 | 8/1986 |
| JP | 05-200539 | 8/1993 |
| JP | 07-231145 | 8/1995 |

OTHER PUBLICATIONS

Semiconductor Lasers on Si Substrates Using the Technology of Bonding by Atomic Rearrangement; Y.H. Lo, R. Bhat, D.M. Hwang, C. Chua, C.-H. Lin; Mar. 8, 1993; pp. 1038–1040.

High–Quality Eutectic–Metal–Bonded AlGaAs–GaAs Thin Films on Si Substrates; R. Venkatasubramanian, M.L. Timmons, T.P. Humphreys, B.M. Keyes, R.K. Ahrenkiel; Feb. 17, 1992; pp. 886–888.

Van der Waals Bonding of GaAs on Pd Leads to a Permanent, Solid–Phase–Topotaxial, Metallurgical Bond; E. Yablonovitch, T. Sands, D.M. Hwang, I. Schnitzer, T.J. Gmitter, S.K. Shastry, D.S. Hill, J.C.C. Fan; Dec. 9, 1991; pp. 3159–3161.

*Primary Examiner*—Eddie Lee
*Assistant Examiner*—Samuel A Gebremariam
(74) *Attorney, Agent, or Firm*—Harness, Dickey & Pierce, P.L.C.

(57) ABSTRACT

A mountable microstructure is provided for mounting with high positional accuracy a compound semiconductor element such as a surface emitting laser element engaged under gravity in concavities on an upper surface of a substrate. A surface emitting laser element 2 is formed on an upper surface of a Si block 1 formed at high accuracy in the same shape as concavities on the upper surface of a substrate by Si anisotropic etching. In the case of a surface emitting laser, since problems such as lattice mismatch occur when an epitaxial layer is grown on the Si substrate, the epitaxial layer 14 is grown on for example a GaAs substrate 11, and this is inverted to bond onto an Si substrate 17. Then after forming the surface emitting laser element 2, the Si block is shaped and divided up by anisotropic etching. Other elements may be formed on the Si block, however, in order to individually drive compound semiconductor elements, a high resistance layer 23 or a current blocking layer 24 is installed in an internal layer 22 between the two. If electrodes are provided on the upper surface of the Si substrate 17, prober inspection is facilitated.

24 Claims, 10 Drawing Sheets

U.S. PATENT DOCUMENTS

| | | | |
|---|---|---|---|
| 5,391,515 A | * 2/1995 | Kao et al. | 438/509 |
| 5,545,291 A | 8/1996 | Smith et al. | |
| 5,783,856 A | * 7/1998 | Smith et al. | 257/618 |
| 5,824,186 A | 10/1998 | Smith et al. | |
| 5,904,545 A | 5/1999 | Smith et al. | |
| 6,069,908 A | * 5/2000 | Yuen et al. | 372/96 |

* cited by examiner

MOUNTABLE MICROSTRUCTURE AND OPTICAL TRANSMISSION APPARATUS

BACKGROUND OF THE INVENTION

1. Field of the Invention

The present invention relates to a mountable microstructure used when mounting an element on a base substance (substrate), and is suitable for example for an optical interconnection device between laminated IC chips as with for example a one-chip computer.

2. Description of the Related Art

In order to achieve even higher speed for a computer, a one-chip computer is considered where IC chips, such as a CPU and DRAM, is laminated, and the exchange of data between chips is performed with optical signals. Regarding an optical interconnection device for such a one-chip computer, if for example respective IC chips are laminated so that the light emitting element of a certain IC chip faces a light receiving element of another IC chip, the emission light of one light emitting element can be directly received by the other IC chip. Consequently, if data is carried in the light, then data transmission between IC chips can be performed at high speed. Furthermore, if the IC chip provided with the light receiving element is further laminated, the signal of one light emitting element can be received by a plurality of light receiving elements, that is the data of one IC chip can be transmitted simultaneously to a plurality of other IC chips. Therefore an extremely high speed optical bus can be formed. For the light emitting element of such an optical interconnection device between laminated IC chips, a vertical resonator type surface emitting laser element for which the aperture of the discharge port is small is ideal.

On the other hand, there is an element mounting technique disclosed for example in U.S. Pat. No. 5,904,545. This element mounting technique, as shown in FIG. 10 involves for example forming concavities A of a predetermined shape on an upper surface of a base substance C of for example a substrate or a film or the like, molding microstructures B of a shape for engaging in these concavities, mixing the microstructures B in a predetermined fluid to make a slurry, and then flowing this slurry along the upper surface of the base substance C so that elements comprising the microstructures B of the same shape as the concavities A are engaged under gravity in the concavities A, to thereby mount these. In this conventional technology also there is disclosure of forming for example a surface emitting laser element comprising GaAs, into a microstructure of a shape for engaging in the concavities, and mounting the surface emitting laser element by means of the aforementioned mounting technique. Here the base substance is formed from Si and the concavities on the upper surface of the base substance are formed by Si anisotropic etching.

Incidentally, as is well known, in Si anisotropic etching, the accuracy of the shape to be formed is extremely high. That is, the shape of the concavities formed on the upper surface of the base substance has an extremely good accuracy. However, with a compound semiconductor represented by the surface emitting laser element, even if anisotropic etching is effected, the accuracy of the shape is not very high. That is, for a microstructure of a compound semiconductor formed by anisotropic etching, the shape accuracy is inferior. Consequently, no matter how high the shape accuracy of the concavities on the surface of the base substance, the shape accuracy of the microstructures of the compound semiconductor is low, and hence the positioning accuracy for mounting as an element is low.

BRIEF SUMMARY OF THE INVENTION

The present invention has been developed in order to solve the above problems, with the object of providing a mountable microstructure for which the element mounting location accuracy is extremely high.

In order to solve the above problems, a mountable microstructure according to a first aspect of the present invention is a mountable microstructure which is engaged and mounted in a concavity formed at a predetermined location on an upper surface of a base substance, by mixing in a fluid to form a slurry and flowing the slurry over the upper surface of the base substance, wherein there is provided an Si block of a shape for engaging in the concavity on the upper surface of the base substance, and a compound semiconductor element formed on an upper surface of the block.

Moreover, a mountable microstructure according to a second aspect of the present invention is one where in the first aspect, the Si block and the compound semiconductor element are bonded by a compound semiconductor-Si direct bonding.

Furthermore, a mountable microstructure according to a third aspect of the present invention is one where in the first aspect, the Si block and the compound semiconductor element are bonded by an InP-Si direct bonding.

Moreover, a mountable microstructure according to a fourth aspect of the present invention is one where in the first aspect, the Si block and the compound semiconductor element are bonded by a GaAs—Si direct bonding.

Furthermore, a mountable microstructure according to a fifth aspect of the present invention is one where in the first aspect, the Si block and the compound semiconductor element are bonded via a metal film.

Moreover, a mountable microstructure according to a sixth aspect of the present invention is one where in the first aspect, the Si block and the compound semiconductor element are bonded via solder.

Furthermore, a mountable microstructure according to a seventh aspect of the present invention is one where in the first aspect, the Si block and the compound semiconductor element are bonded via resin.

Moreover, a mountable microstructure according to an eighth aspect of the present invention is one where in the first aspect, the Si block and the compound semiconductor element are bonded via an $SiO_2$ film.

Furthermore, a mountable microstructure according to a ninth aspect of the present invention is one where in the first aspect, the Si block and the compound semiconductor element are bonded via an $SiO_2$ film and an AlGaAs layer.

Moreover, a mountable microstructure according to a tenth aspect of the present invention is one where in any one of the first through ninth aspects, a plurality of the compound semiconductor elements are formed on each Si block.

Furthermore, a mountable microstructure according to an eleventh aspect of the present invention is one where in any one of the first through tenth aspects, individual elements are formed on the Si block itself.

Moreover, a mountable microstructure according to a twelfth aspect of the present invention is one where in the eleventh aspect, the individual elements formed on the Si block itself and the compound semiconductor element are arranged so as to overlap or face each other.

Furthermore, a mountable microstructure according to a thirteenth aspect of the present invention is one where in the eleventh aspect, the individual elements formed on the Si block itself and the compound semiconductor element are arranged so as to be displaced from each other.

Moreover, a mountable microstructure according to a fourteenth aspect of the present invention is one where in any one of the first through thirteenth aspects, all of the electrodes for the compound semiconductor element are formed on the upper surface of the Si block.

Furthermore, a mountable microstructure according to a fifteenth aspect of the present invention is one where in any one of the first through thirteenth aspects, any one of the electrodes for the compound semiconductor element is made common with the electrodes for the Si block.

Moreover, a mountable microstructure according to a sixteenth aspect of the present invention is one where in the fifteenth aspect, a high resistance layer with a resistance greater than $1 \times 10^4$ Ω is provided between the compound semiconductor element electrode formed on the upper surface of the Si block and the Si block.

Furthermore, a mountable microstructure according to a seventeenth aspect of the present invention is one where in the sixteenth aspect, the high resistance layer comprises a compound semiconductor.

Moreover, a mountable microstructure according to an eighteenth aspect of the present invention is one where in the sixteenth aspect, the high resistance layer comprises a compound semiconductor doped with Cr and O.

Furthermore, a mountable microstructure according to a nineteenth aspect of the present invention is one where in the sixteenth aspect, the high resistance layer comprises an oxide.

Moreover, a mountable microstructure according to a twentieth aspect of the present invention is one where in the sixteenth aspect, the high resistance layer comprises a nitride.

Furthermore, a mountable microstructure according to a twenty first aspect of the present invention is one where in the sixteenth aspect, the high resistance layer comprises a resin.

Moreover, a mountable microstructure according to a twenty second aspect of the present invention is one where in the fifteenth aspect, a current blocking layer using a PN connection is provided between the compound semiconductor element electrode formed on the upper surface of the Si block and the Si block.

Furthermore, a mountable microstructure according to a twenty third aspect of the present invention is one where in the twenty second aspect, the current blocking layer is formed by laminating layers of a P-type semiconductor and an N-type semiconductor in PNP or NPN order.

Moreover, a mountable microstructure according to a twenty fourth aspect of the present invention is one where in the twenty third aspect, a contact layer in the immediate vicinity of the Si block is used as the P-type semiconductor or the N-type semiconductor constituting the current blocking layer.

An optical transmission apparatus according to a twenty fifth aspect of the present invention is one where a base substance with a mountable microstructure according to any one of the first through twenty fourth aspects which includes a light emitting element mounted in a concavity, and a base substance with a mountable microstructure according to any one of the first through twenty fourth aspects which includes a light receiving element mounted in a concavity, are laminated so that the light emitting element and the light receiving element face each other.

An optical transmission apparatus of a twenty sixth aspect of the present invention is one having a light emitting section comprising a base substance with a mountable microstructure according to any one of the first through twenty fourth aspects which includes a light emitting element mounted in a concavity, and a light receiving section comprising a base substance with a mountable microstructure according to any one of the first through twenty fourth aspects which includes a light receiving element mounted in a concavity.

In the mountable microstructure according to the first aspect of the present invention, the construction is such that the compound semiconductor element is formed on the upper surface of the Si block of a shape for engaging with the concavity on the upper surface of the base substance. Therefore the shape accuracy of the Si block can be increased by anisotropic etching, and this Si block is engaged in a concavity with a high shape accuracy, so that the mounting position accuracy of the compound semiconductor element is increased.

Furthermore, in the mountable microstructure according to the second aspect of the present invention, the construction is such that the Si block and the compound semiconductor element are bonded by direct bonding. Therefore the mountable microstructure according to the first aspect can be easily implemented.

Moreover, in the mountable microstructure according to the third aspect of the present invention, the construction is such that the Si block and the compound semiconductor element are bonded by an InP—Si direct bonding. Therefore the mountable microstructure according to the first aspect can be easily implemented.

Furthermore, in the mountable microstructure according to the fourth aspect of the present invention, the construction is such that the Si block and the compound semiconductor element are bonded by a GaAs—Si direct bonding. Therefore the mountable microstructure according to the first aspect can be easily implemented.

Moreover, in the mountable microstructure according to the fifth aspect of the present invention, the construction is such that the Si block and the compound semiconductor element are bonded via a metal film. Therefore the mountable microstructure according to the first aspect can be easily implemented.

Furthermore, in the mountable microstructure according to the sixth aspect of the present invention, the construction is such that the Si block and the compound semiconductor element are bonded via solder. Therefore the mountable microstructure according to the first aspect can be easily implemented.

Moreover, in the mountable microstructure according to the seventh aspect of the present invention, the construction is such that the Si block and the compound semiconductor element are bonded via resin. Therefore the mountable microstructure according to the first aspect can be easily implemented, and the resin becomes an insulating layer between the compound semiconductor element and the Si block.

Furthermore, in the mountable microstructure according to the eighth aspect of the present invention, the construction is such that the Si block and the compound semiconductor element are bonded via an $SiO_2$ film. Therefore the mountable microstructure according to the first aspect can be easily implemented.

Moreover, in the mountable microstructure according to the ninth aspect of the present invention, the construction is such that the Si block and the compound semiconductor element are bonded via an $SiO_2$ film and an AlGaAs layer. Therefore the mountable microstructure according to the first aspect can be easily implemented.

Furthermore, in the mountable microstructure according to the tenth aspect of the present invention, the construction is such that a plurality of the compound semiconductor elements are formed on each Si block. Therefore even higher density mounting is possible.

Moreover, in the mountable microstructure according to the eleventh aspect of the present invention, the construction is such that individual elements are formed in the Si block itself. Therefore not only can the compound semiconductor element be simply mounted on a base substance, but a plurality of functions can be obtained with a single mountable microstructure, and even higher density mounting is possible.

Furthermore, in the mountable microstructure according to the twelfth aspect of the present invention, the construction is such that the individual elements formed on the Si block itself and the compound semiconductor element are arranged so as to overlap or face each other. Therefore for example in the case where the compound semiconductor element is a light emitting element, and the individual elements formed on the Si block itself are light receiving elements, the light emitting condition of the light emitting element can be monitored by the light receiving elements.

Moreover, in the mountable microstructure according to the thirteenth aspect of the present invention, the construction is such that the individual elements formed on the Si block itself and the compound semiconductor element are arranged so as to be displaced from each other. Therefore for example in the case where the compound semiconductor element is a light emitting element, and the individual elements formed on the Si block itself are light receiving elements, if the base substance is arranged so that two mountable microstructures face each other in opposite directions, the light emitting condition of mutual light emitting elements can be monitored by mutual light receiving elements.

Furthermore, in the mountable microstructure according to the fourteenth aspect of the present invention, the construction is such that all of the electrodes for the compound semiconductor element are formed on the upper surface of the Si block. Therefore inspection of the compound semiconductor element is facilitated. Furthermore, in the case where individual elements are formed on the Si block itself, the elements of the Si block itself and the compound semiconductor element can be easily driven individually.

Moreover, in the mountable microstructure according to the fifteenth aspect of the present invention, the construction is such that any one of the electrodes for the compound semiconductor element is made common with the electrodes for the Si block. Therefore the number of electrodes can be reduced, and simplification of construction and a lower cost can be achieved.

Furthermore, in the mountable microstructure according to the sixteenth aspect of the present invention, the construction is such that the high resistance layer with a resistance greater than $1 \times 10^4$ $\Omega$ is provided between the compound semiconductor element electrode formed on the upper surface of the Si block and the Si block. Therefore in the case where individual elements are formed on the Si block itself, the elements of the Si block itself and the compound semiconductor element are insulated, and can be easily driven individually.

Moreover, in the mountable microstructure according to the seventh aspect of the present invention, the construction is such that the high resistance layer comprises a compound semiconductor. Therefore the mountable microstructure according to the sixteenth aspect can be easily implemented.

Furthermore, in the mountable microstructure according to the eighteenth aspect of the present invention, the construction is such that the high resistance layer comprises a compound semiconductor doped with Cr and O. Therefore the mountable microstructure according to the sixteenth aspect can be easily implemented.

Moreover, in the mountable microstructure according to the nineteenth aspect of the present invention, the construction is such that the high resistance layer comprises an oxide. Hence the high resistance layer can be easily formed by for example oxidizing the Si block. Therefore the mountable microstructure according to the sixteenth aspect can be easily implemented.

Furthermore, in the mountable microstructure according to the twentieth aspect of the present invention, the construction is such that the high resistance layer comprises a nitride. Hence the high resistance layer can be easily formed by for example nitriding the Si block. Therefore the mountable microstructure according to the sixteenth aspect can be easily implemented.

Moreover, in the mountable microstructure according to the twenty first aspect of the present invention, the construction is such that the high resistance layer comprises a resin. Therefore the mountable microstructure according to the sixteenth aspect can be easily implemented.

Furthermore, in the mountable microstructure according to the twenty second aspect of the present invention, the construction is such that the current blocking layer using a PN connection is provided between the compound semiconductor element electrode formed on the upper surface of the Si block and the Si block. Therefore, in the case where individual elements are formed on the Si block itself, the elements of the Si block itself and the compound semiconductor element are insulated, and can be easily driven individually. Moreover, the current blocking layer can be easily formed by semiconductor processing the Si block.

Moreover, in the mountable microstructure according to the twenty third aspect of the present invention, the construction is such that the current blocking layer is formed by laminating layers of a P-type semiconductor and an N-type semiconductor in PNP or NPN order. Therefore the current blocking layer can be easily formed by semiconductor processing of the Si block.

Furthermore, in the mountable microstructure according to the twenty fourth aspect of the present invention, the construction is such that the contact layer in the immediate vicinity of the Si block is used as the P-type semiconductor or the N-type semiconductor constituting the current blocking layer. Therefore the formation of the current blocking layer is further simplified, and a simplification of construction and a lower cost is possible.

DETAILED DESCRIPTION OF THE INVENTION

Figure 1A:
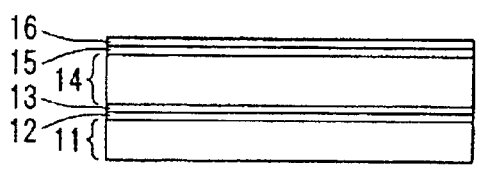
FIG. 1A through FIG. 1I are manufacture explanatory diagrams showing a first embodiment of a mountable microstructure according to the present invention.

Hereunder is a description of embodiments of the present invention. FIG. 1A through FIG. 1I are explanatory diagrams for a manufacturing process illustrating a first embodiment of a mountable microstructure of the present embodiment, FIG. 1I showing the completed condition as a mountable microstructure. This embodiment is one which is used in the beforementioned conventional element mounting technique. A surface emitting laser element 2 serving as a compound semiconductor element is formed on an upper surface of an Si block 1 for engagement in concavities on an upper surface of a base substance such as the aforementioned substrate. In the connection between the Si block 1 and the surface emitting laser element 2 a later described InP—Si direct connection is used.

In this embodiment, at first as shown in FIG. 1A, an etching stop layer 12 is formed on an n-type GaAs substrate 11, an n contact layer 13 is formed on this, a surface emitting laser epitaxial layer 14 is formed on this, a p contact layer 15 is formed on this, and an InP layer 16 is formed on this. For the etching stop layer 12, for example an AlGaAs layer or an AlAs layer with a high Al composition is used. With regards to the n contact layer 13 and the p contact layer 15, it is necessary that both of these are a material whereby ohmic contact with later described respective electrodes is possible. In the case of an AlGaAs based material, for example GaAs doped with an impurity of a high concentration of more than $10^{18}$ cm$^{-3}$ is used.

The surface emitting laser epitaxial layer 14 is constructed by laminating 25 pairs of upper distributed reflection type multi-layer mirrors (hereunder referred to simply as upper DBR mirrors) formed on the n contact layer 13, a quantum well active layer formed on this, and 30 pairs of lower distributed reflection type multi-layer mirrors (referred to hereunder simply as lower DBR mirrors) formed on this. The upper DBR mirrors are formed by alternately laminating $Al_{0.15}Ga_{0.85}As$ and AlAs, and doping with Se. Consequently, the upper DBR mirrors are n-type. The quantum well active layer comprises a GaAs well layer of 3 nm thickness and an $Al_{0.3}Ga_{0.7}As$ barrier layer of 3 nm thickness, and the well layer is formed in three layers. Furthermore, the lower DBR mirror is formed by alternately laminating $Al_{0.15}Ga_{0.85}As$ and $Al_{0.9}Ga_{0.1}As$, and doping with Zn. Consequently, the lower DBR mirror is a p-type.

Each of the layers may be epitaxially grown by Metal-Organic Vapor Phase Epitaxy (MOVPE). At this time, for example the growth temperature is 700° C., and the growth pressure is $2 \times 10^4$ Pa. In the present embodiment requiring InP, TMGa (trimethyl gallium) TmAl (trimethyl aluminum) and TmI (trimethyl indium) are used as III group raw materials, and AsH$_3$ and PH$_3$ (phosphine) are used a V group raw materials. Furthermore, in the n-type doping H$_2$Se can be used, while in the P type doping DEZn (dimethyl zinc) can be used.

Since the aforementioned upper DBR mirror is an n-type and the lower DBR mirror is a p-type, a pin diode is formed with a structure with a quantum well active layer which is not doped with an impurity. When a forward direction voltage is applied to this pin diode, then in the quantum well active layer a recombination of electrons and electron holes occurs, and recombination radiation is produced. Then, when the produced light oscillates between the upper DBR mirror and the lower DBR mirror, stimulated emission occurs, and the intensity of the light is amplified. As a result, when the optical gain exceeds the optical loss, laser oscillation occurs, and laser light is radiated out in a perpendicular direction with respect to the epitaxial layer face of the surface emitting laser, that is the vertical direction in the figures.

In this embodiment, as mentioned later, the surface emitting laser epitaxial layer 14 serving as the compound semiconductor element, is formed on the GaAs substrate 11 for which epitaxial growth is easy, and this is then affixed to a separate Si substrate 17 used for the Si block 1. This is to obtain a favorable epitaxial layer by avoiding the many problems which arise when the compound semiconductor is made by epitaxy directly on the Si substrate. For example problems of distortion and the like due to lattice mismatch or disagreement in coefficient of thermal expansion.

Figure 1F:
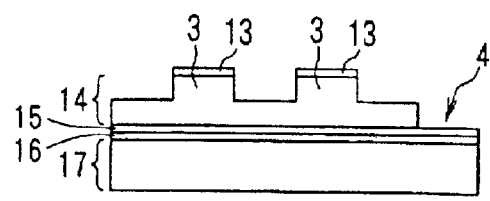
Figure 1B:
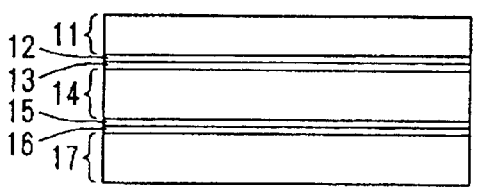

Next, as shown in FIG. 1B, the surface emitting laser epitaxial layer 14 of FIG. 1A is inverted and superimposed on the separately prepared Si substrate 17 for which the oxide film has been removed, and the InP layer 16 is closely contacted with the surface of the Si substrate 17. Then by applying pressure and heating, the two members are bonded by an InP-Si direct bonding. The Inp-Si direct bonding is detailed for example in Appl. Phys. Lett. 62 (10), Mar. 8, 1993 pp. 1038–1040, or IEEE Photonics Technology Letters, Vol. 8, No. 2 February 1996 pp. 173–175, or Jpn. J. Appl. Phys. Vol. 33 (1994) pp. 4878–4879.

Figure 1G:
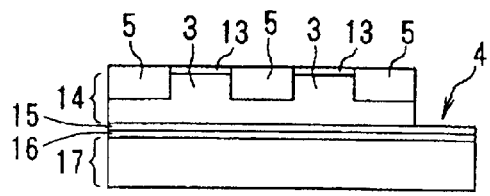
Figure 1C:
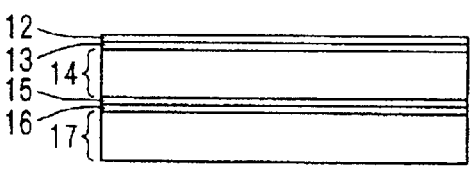

Then, as shown in FIG. 1C, the GaAs substrate 11 is removed by selective etching. In the selective etching, an alkali based etchant, for example a mixed liquid of aqua ammonia and hydrogen peroxide solution is used.

Figure 1H:
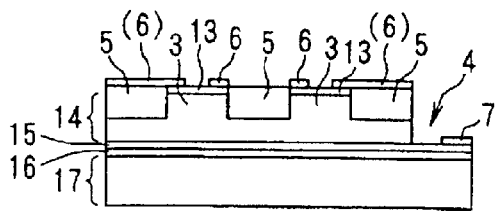
Figure 1D:
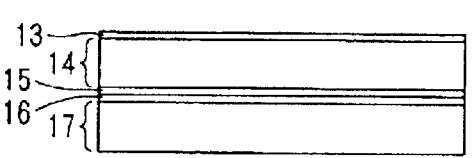
Figure 1:
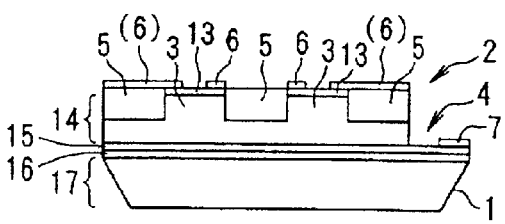

Next, as shown in FIG. 1D, the etching stop layer 12 is removed by a buffer hydrofluoric acid or the like.

Figure 1E:
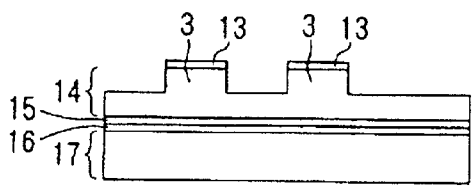

Then, as shown in FIG. 1E, the surface emitting laser epitaxial layer 14 is etched to a mesa form by a dry etching method, with a resist layer or the like provided on the n contact layer 13 as a mask, to thereby form columnar portions 3. The method of forming the resist layer involves patterning with a photolithography method, photoresist which has been applied to the surface of the n contact layer 13, to thereby form a resist layer of a predetermined pattern. Furthermore, for the dry etching, normally, a reactive iron beam etching method which uses a chlorine or chlorine based gas (hydrogen chloride, $SiCl_4$, $BCl_3$) as an etching gas is used.

Next, as shown in FIG. 1F, contact holes 4 which expose the p contact layer 15 are formed by forming a resist layer which covers the columnar portions 3 and the surroundings thereof, and then with this resist layer as a mask, etching the remaining surface emitting laser epitaxial layer 14 using a dry etching method. The resist layer forming method and the dry etching method are the same as for FIG. 1E.

Then, as shown in FIG. 1G, a polyimide insulating layer 5 is formed around the columnar portions 3. Here, after spin coating a photosensitive polyimide precursor on the surface, the upper surface of the columnar portions 3 and the lower surface of the contact holes 4, that is the upper surface of the p contact layer 15, are exposed by a photolithography method, and these are subjected to heat treatment in a nitrogen atmosphere (400° C.) and changed to a polyimide resin. As a result, the polyimide insulating layer 5 is formed so as to fill in around the columnar portions 3.

Then, as shown in FIG. 1H, ring shaped cathode electrodes 6 are formed on the n contact layer 13 of the upper surface of the columnar portions 3 and anode electrodes 7 are formed on the p contact layer 15 inside the contact holes 4. As a result, a surface emitting laser element 2 comprising a pin diode on the columnar portions 3 of the surface emitting laser epitaxial layer 14 is formed. Here the cathode electrode 6 is an AuGe alloy and the anode electrode 7 is an AuZn alloy.

Figure 10:
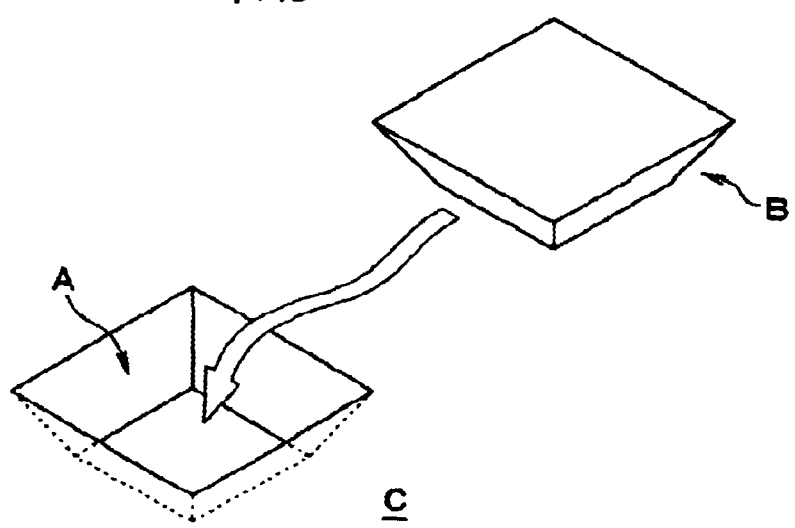
FIG. 10 is an explanatory diagrams for an element mounting technique.

Next, as shown in FIG. 1I, the Si substrate 17 is anisotropically etched to form the Si block 1 of a shape to engage with the concavities of FIG. 10. As a result, the mountable microstructure comprising the Si block 1 with the surface emitting laser element 2 formed on the upper surface is completed. In this embodiment, the surface emitting laser element 2 is inspected with a prober before the Si block is divided up by anisotropic etching. At this time, in this embodiment, since both the cathode terminals 6 and the anode terminals 7 are both formed on the upper side of the Si substrate 17, inspection using the prober is easily performed. Here the Si block 1 is one where the side faces are trapezoidal with the lower surface shape smaller than the upper surface shape.

In this manner, in the mountable microstructure of this embodiment, compound semiconductor elements such as surface emitting laser elements 2 are provided on the upper surface of the Si block 1. Therefore if the Si block 1 is formed by Si anisotropic etching the shape accuracy is high, and if the base substance such as the substrate is made of Si, and the concavities formed on the upper surface thereof are formed by Si anisotropic etching the shape accuracy of the concavities is also high. Therefore the fitting accuracy when the Si block 1 is engaged in the concavities is increased, and the mounting position accuracy of the compound semiconductor on the upper surface of the Si block 1 can be increased.

In the present embodiment, InP—Si direct bonding is given as the compound semiconductor—irect bonding. However this can be performed with GaAs—Si direct bonding. However this GaAs—Si direct bonding however, since the migration of the atoms at the bonding surface is less than with the InP, heat treatment at a higher temperature is necessary.

Next is a description of second embodiment of a mountable microstructure of the present invention, using FIG. 2A through FIG. 2E. This embodiment is one where for example the Si block 1 of the first embodiment and the surface emitting laser element 2 serving as the compound semiconductor element are bonded via a metal film.

Figure 2A:
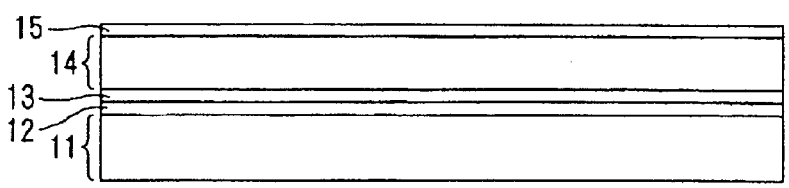
FIG. 2A through FIG. 2E are manufacture explanatory diagrams showing a second embodiment of a mountable microstructure according to the present invention.

FIG. 2A shows a GaAs substrate 11, an etching stop layer 12, an n contact layer 13, a surface emitting laser epitaxial layer 14 and a p contact layer 15 formed similarly to the first embodiment. However this differs from the first embodiment in that there is no InP layer 16.

Figure 2B:
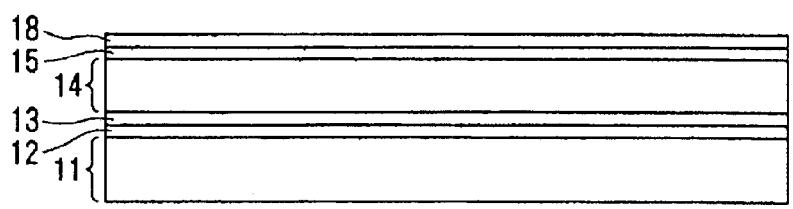
Figure 2C:
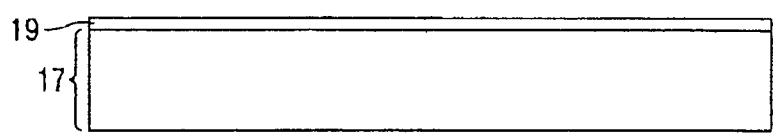

For the surface emitting laser epitaxial layer 14, as shown in FIG. 2B a GaAs layer 18 is formed on the upper surface of the p contact layer 15. This GaAs layer 18 can be easily formed during the epitaxy. Next, as shown in FIG. 2C, a Pd film 19 is formed on the upper surface of the Si substrate 17. This Pd film 19 is formed for example by sputtering, vacuum deposition, plating or the like.

Figure 2D:
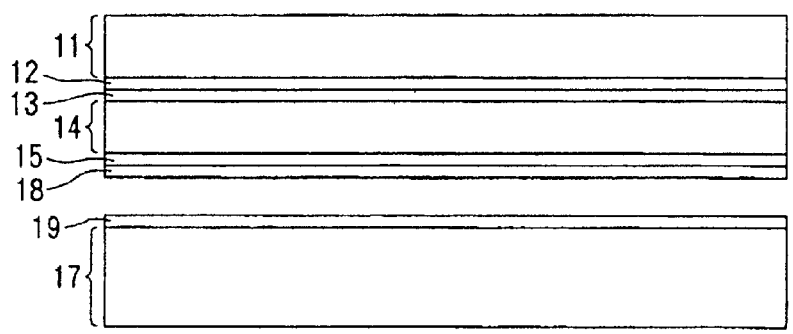
Figure 2E:
Figure 2E:
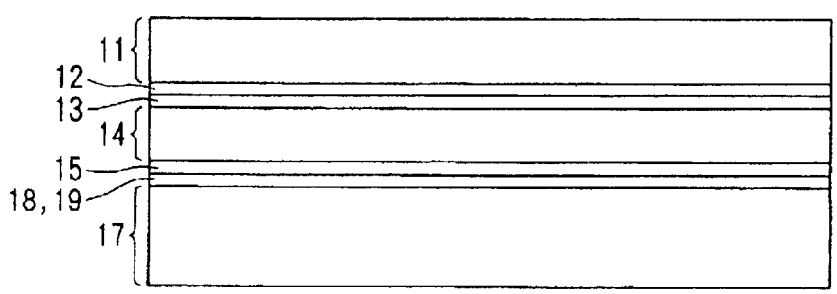

Next, as shown in FIG. 2D, the surface emitting laser epitaxial layer 14 of FIG. 2B is inverted and superimposed on the Si substrate 17, and the GaAs layer 18 is closely contacted with the Pd film 19 on the upper surface of the Si substrate 17 via water. Then by applying pressure and heating, the surface emitting laser epitaxial layer 14 and the Si substrate 17 are bonded as shown in FIG. 2E. Such a GaAs—Pd metal film interposed bonding technique is detailed for example in Appl. Phys. Lett. 59 (24), Dec. 9, 1991 pp. 3159–3161.

In this metal film interposed bonding, there is also a technique using Au instead. That is, an Au layer is provided on the upper surface of the p contact layer 15 and the upper surface of the Si substrate 17, and the surface emitting laser epitaxial layer 14 is inverted and superimposed on the Si substrate 17, and the Au layer pairs are closely contacted. Then by applying pressure and heating, the surface emitting laser epitaxial layer 14 and the Si substrate 17 are bonded. Such an Au metal film interposed bonding technique is detailed for example in Appl. Phys. Lett. 60 (7), February 1992 pp. 886–888.

Furthermore, there is also a method of bonding the surface emitting laser epitaxial layer 14 and the Si substrate 17 using solder. If In material is used in the solder, both the surface emitting laser epitaxial layer 14 and the Si substrate 17 can be bonded without treatment.

The subsequent manufacturing of the surface emitting laser element 2 and the forming of the Si block 1 is the same as for FIG. 1D through FIG. 1I of the first embodiment.

Figure 3A:
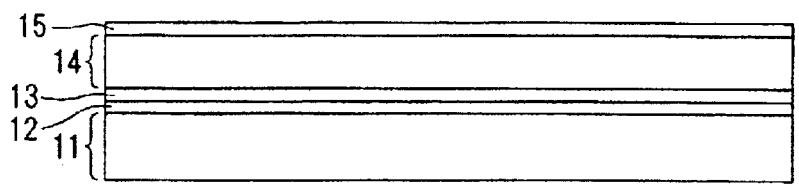
FIG. 3A through FIG. 3C are manufacture explanatory diagrams showing a third embodiment of a mountable microstructure according to the present invention.
Figure 3B:
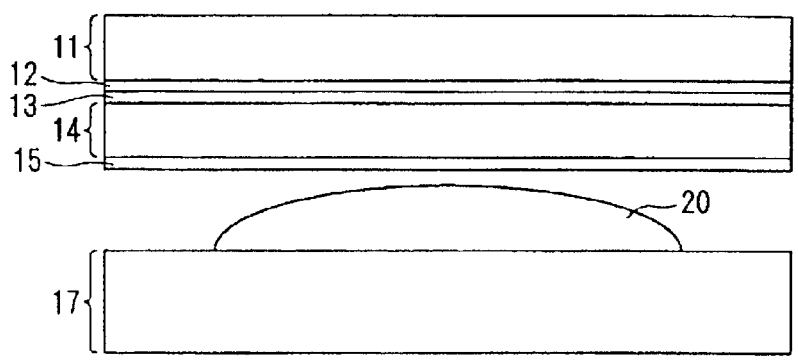
Figure 3C:
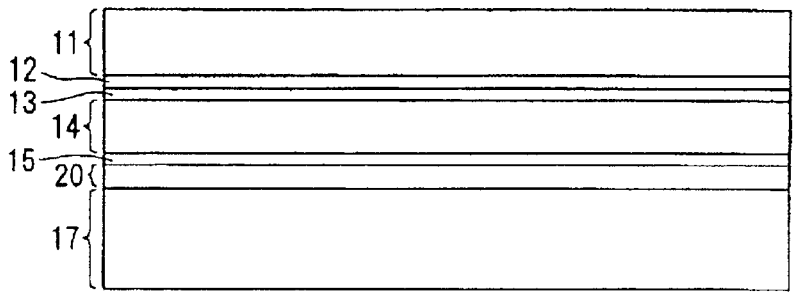

Next is a description of third embodiment of a mountable microstructure of the present invention, using FIG. 3A through FIG. 3C. This embodiment is one where for example the Si block 1 of the first embodiment and the surface emitting laser element 2 serving as the compound semiconductor element are bonded by a resin, that is, an adhesive.

FIG. 3A shows a GaAs substrate 11, an etching stop layer 12, an n contact layer 13, a surface emitting laser epitaxial layer 14 and a p contact layer 15 formed similarly to the first embodiment. However this differs from the first embodiment in that there is no InP layer 16.

For the surface emitting laser epitaxial layer 14, as shown in FIG. 3B, a resin adhesive 20 is added to the upper surface of the Si substrate 17, and the surface emitting laser epitaxial layer 14 of FIG. 3A is inverted and superimposed on the Si substrate 17. Then a slight pressure is applied, and as shown in FIG. 3C, the surface emitting laser epitaxial layer 14 and the Si substrate 17 are bonded. For the resin adhesive 20, a polyimide resin and the like can be given as examples.

The bonding method for the surface emitting laser epitaxial layer 14 and the Si substrate 17 is extremely simple, and altogether, there are no problems even if the top of the Si substrate 17 is not smooth.

The subsequent manufacturing of the surface emitting laser element 2 and the forming of the Si block 1 is the same as for FIG. 1D through FIG. 1I of the first embodiment.

Figure 4:
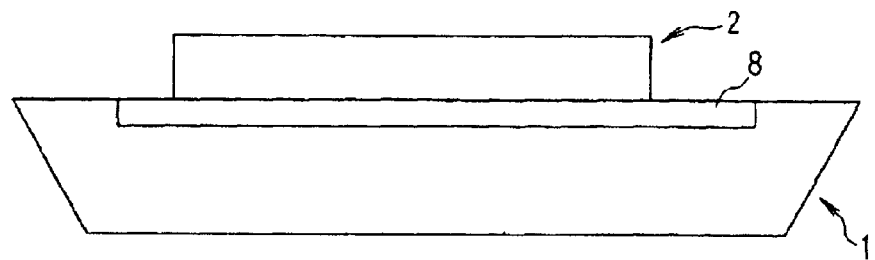
FIG. 4 is a schematic diagram showing a fourth embodiment of a mountable microstructure of the present invention.

Next is a description of a fourth embodiment of a mountable microstructure of the present invention, using FIG. 4. This embodiment is one where, in addition to the compound semiconductor element such as the surface emitting laser element 2 provided on the upper surface of the Si block 1, an element 8 is also formed on the Si block 1 itself. In this way, a plurality of elements are mounted in a stacked condition. Therefore the packaging density can be further increased.

In the case where in this way, the element 8 is also formed on the Si block 1 itself, then for example if an electrode common with the compound semiconductor element is formed on the bottom surface of the Si block 1, the number of electrodes can be reduced, and simplification of construction and a lower cost can be achieved.

Figure 5:
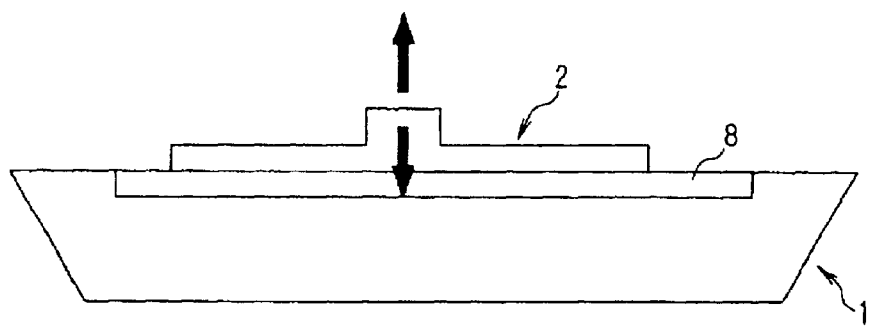
FIG. 5 is a schematic diagram showing a fifth embodiment of a mountable microstructure of the present invention.

Next is a description of a fifth embodiment of a mountable microstructure of the present invention, using FIG. 5. This embodiment is one where, directly beneath the surface emitting laser element 2 provided on the upper surface of the Si block 1 as the compound semiconductor element, a photodiode 8 is arranged as the element provided on the Si block 1 itself. That is, the surface emitting laser element 2 and the photodiode 8 are arranged so as to overlap or face each other. Therefore with this embodiment, the operating state of the surface emitting laser element 2 can be monitored by the photodiode 8.

Figure 6:
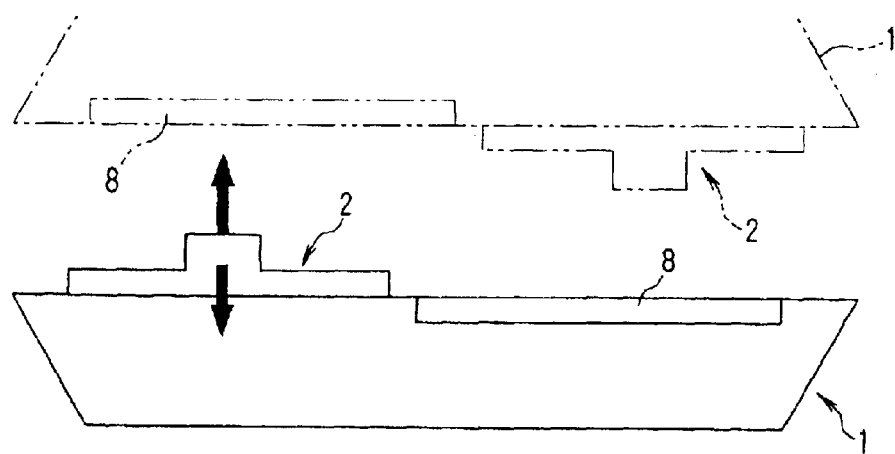
FIG. 6 is a schematic diagram showing a sixth embodiment of a mountable microstructure of the present invention.

Next is a description of a sixth embodiment of a mountable microstructure of the present invention, using FIG. 6. This embodiment is one where the surface emitting laser element 2 provided on the upper surface of the Si block 1 as the compound semiconductor element, and a photodiode 8 serving as the element provided on the Si block 1 itself are arranged so as to be displaced from each other. Therefore with this embodiment, if the base substance such as a substrate is arranged so as to face another mountable microstructure as shown by the two dot chain line in the figure, in mutually opposite directions, the mutual surface emitting laser elements 2 face the mutual photodiodes 8. Therefore the light emitting power of mutual light emitting elements 2 can be monitored by mutual photodiodes 8.

Figure 7:
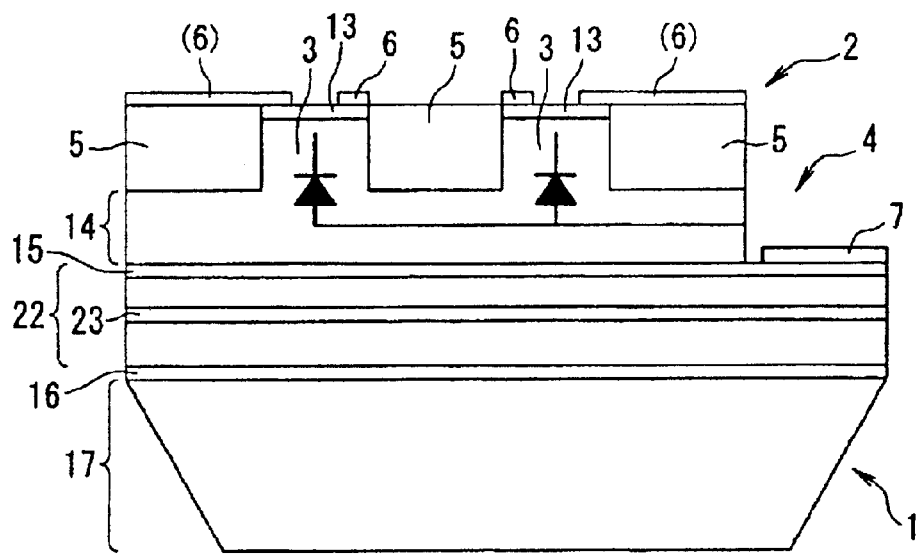
FIG. 7 is a block diagram showing a seventh embodiment of a mountable microstructure of the present invention.

Next is a description of a seventh embodiment of a mountable microstructure of the present invention, using FIG. 7. The surface emitting laser element 2 serving as the compound semiconductor element in the present embodiment and the Si block 1, as with the parts shown in FIG. 1I of the first embodiment are bonded via an InP layer 16. However with this embodiment, the bonding layer involves installing an internal layer 22 between the InP layer 16 and the surface emitting laser element 2, and a high resistance layer 23 with a resistance greater than $1 \times 10^4$ $\Omega$ is provided inside this internal layer 22. The resistance of this high resistance layer 23 is set as described hereunder. For example, the drive current for the case where the compound semiconductor element is a surface emitting layer element 2 or a light emitting diode (not shown in the figure) or the like, is in units of mA. Therefore, if the allowable leakage current is 0.2 mA, since the drive voltage for both the Si semiconductor element and the compound semiconductor element is around 2V, if the resistance value of the insulating layer is greater than $1 \times 10^4$ $\Omega$, the leakage current can be made less than 0.2 mA. This high resistance layer 23 is made for example from a compound semiconductor, in particular a compound semiconductor doped with Cr and O, or an oxide, in particular a Si oxide, or a nitride, in particular an Si nitride, or a resin and so forth. In this way, by installing a high resistance layer 23 between the Si block 1 and the surface emitting laser element 2, that is the compound semiconductor element, then in the case where individual elements are formed on the Si block 1 itself, the elements on the Si block 1 itself and the compound semiconductor element are insulated, and are easily driven individually. The bonding method for the Si block 1 and the compound semiconductor may use the beforementioned other bonding methods. Furthermore, the high resistance layer 23 is arranged between the bonding layer and the Si block 1.

Figure 8:
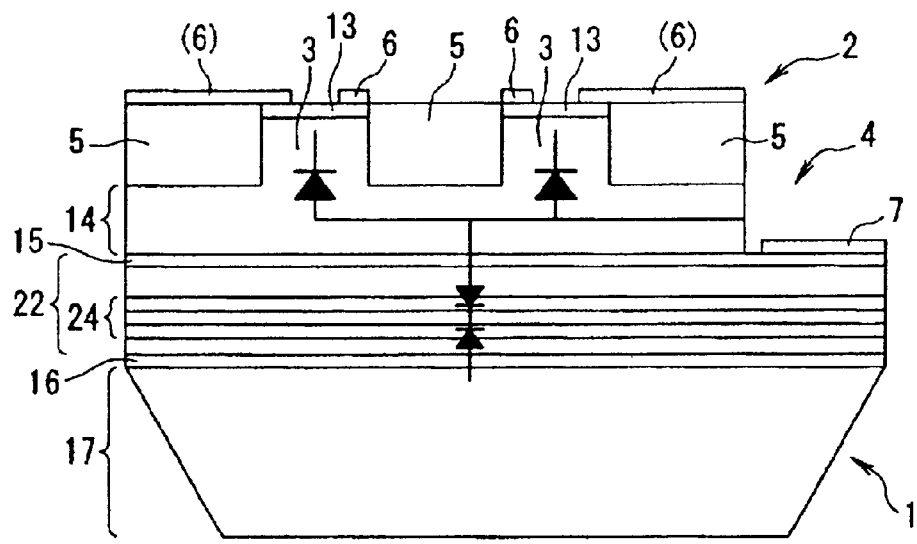
FIG. 8 is a block diagram showing an eighth embodiment of a mountable microstructure of the present invention.

Next is a description of an eighth embodiment of a mountable microstructure of the present invention, using FIG. 8. The surface emitting laser element 2 serving as the compound semiconductor element in the present embodiment and the Si block 1, as with the parts shown in FIG. 1I of the first embodiment are bonded via an InP layer 16. However with this embodiment, an internal layer 22 is installed between the InP layer 16 and the surface emitting laser element 2, and a current blocking layer 24 is provided inside this internal layer 22. This current blocking layer 24 is made by laminating a P-type semiconductor and an N-type semiconductor in PNP or NPN order. This current blocking layer 24 is used as an equivalent to a circuit where a forward diode and a backward diode are series connected between the surface emitting laser element 2, that is the compound semiconductor element, and for example the Si block 1 formed with the element on itself. That is, even if a voltage of positive or negative is applied between the compound semiconductor element and the Si block, since a backward diode always exists, there is no flow of current. Therefore, in the case where for example individual elements are formed on the Si block 1 itself, the elements on the Si block 1 itself and the compound semiconductor element are insulated, and are easily driven individually. The bonding method for the Si block 1 and the compound semiconductor may use the beforementioned other bonding methods.

Figure 9:
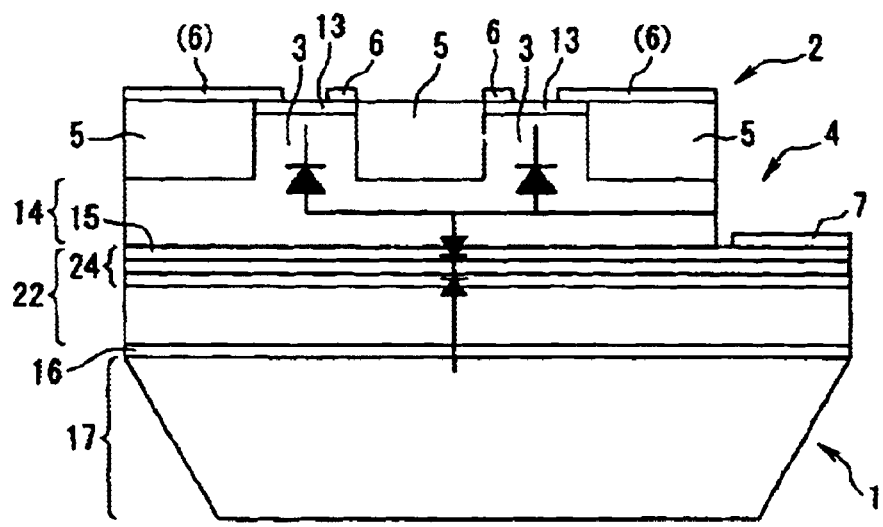
FIG. 9 is a block diagram showing a ninth embodiment of a mountable microstructure of the present invention.

Next is a description of a ninth embodiment of a mountable microstructure of the present invention, using FIG. 9. The surface emitting laser element 2 serving as the compound semiconductor element in the present embodiment and the Si block 1, as with the part shown in FIG. 1I of the first embodiment are bonded via an InP layer 16. However with this embodiment, an internal layer 22 is installed between the InP layer 16 and the surface emitting laser element 2, and a current blocking layer 24 is provided inside this internal layer 22. This current blocking layer 24 is an equivalent circuit to the current blocking layer 24 of the PNP arrangement of the eighth embodiment. In this embodiment however, a p contact layer 15 is used as the upper, that it the P-type semiconductor on the surface emitting laser side, and directly beneath, an N-type semiconductor and P type semiconductor are laminated to thereby form a PNP arranged current blocking layer 24. This operates in exactly the same way as the current blocking layer 24 of the eighth embodiment, so that there is no current flow between the surface emitting laser element 2, that is the compound semiconductor element and the Si block 1. Therefore, in the case where for example individual elements are formed on the Si block 1 itself, the elements on the Si block 1 itself and the compound semiconductor element are insulated, and are easily driven individually. Moreover, the contact layer 15 is used as a semiconductor, and hence simplification of construction and a lower cost is possible. The bonding method for the Si block 1 and the compound semiconductor may use the beforementioned other bonding methods.

In each of the aforementioned embodiments, the microstructures where all made with upper and lower faces square and side faces trapezoidal. However the shape of the microstructures is not limited to this, and for example the upper and lower faces may be rectangular, parallelograms or rhombic shape.

Furthermore, the compound semiconductor element formed on the upper surface of the Si block is not limited to a surface emitting laser element, and for example provided this is a semiconductor element comprising a compound, such as a light emitting diode and the like, any kind of element is applicable.

Next is a description of a tenth embodiment of a mountable microstructure of the present invention, using FIG. 11A through FIG. 11D and FIG. 12E through FIG. 12H. This embodiment is one where, for example the Si block 1 of the first embodiment and the surface emitting laser element 2 serving as the compound semiconductor element are bonded via an $SiO_2$ layer 25 and an AlGaAs layer 24a. Here, a method is used where bonding to the Si substrate is performed after forming the surface emitting laser element 2 on the GaAs substrate.

Figure 11A:
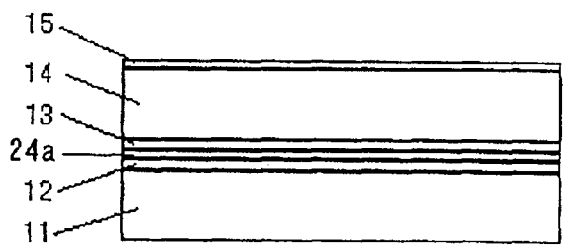
FIG. 11A through FIG. 11D are manufacture explanatory diagrams showing a tenth embodiment of a mountable microstructure according to the present invention.

FIG. 11A shows a GaAs substrate 11, an etching stop layer 12, an AlGaAs layer 24a, an n contact layer 13, a surface emitting laser epitaxial layer 14 and a p contact layer 15 formed similarly to the first embodiment. For the AlGaAs layer 24a, a material where the Al composition is comparatively low at $0<x<0.5$ is suitable. Here $Al_{0.2}Ga_{0.8}As$ is used.

Figure 11B:
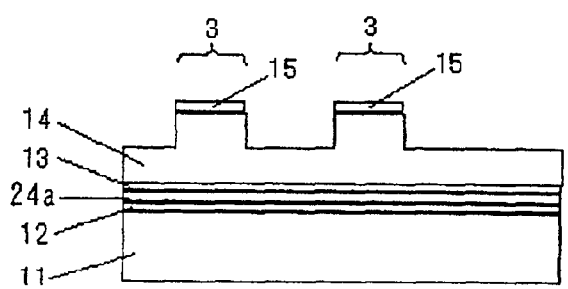

Then, as shown in FIG. 11B, the surface emitting laser epitaxial layer 14 is etched to a mesa form by a dry etching method, with a resist layer or the like provided on the p contact layer 15 as a mask, to thereby form columnar portions 3. The method of forming the resist layer involves patterning with a photolithography method, photoresist which has been applied to the surface of the p contact layer 15, to thereby form a resist layer of a predetermined pattern.

Furthermore, for the dry etching, normally, a reactive iron beam etching method which uses a chlorine or chlorine based gas (hydrogen chloride, $SiCl_4$, $BCl_3$) as an etching gas is used.

Figure 11C:
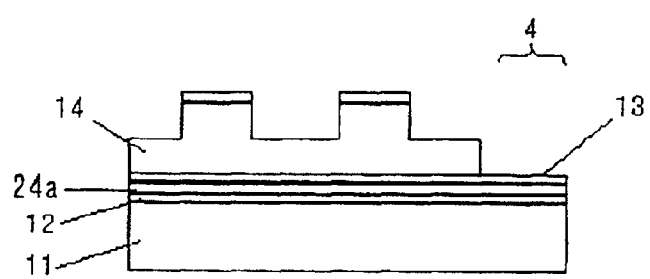

Next, as shown in FIG. 11C, contact holes 4 which expose the n contact layer 13 are formed by forming a resist layer which covers the columnar portions 3 and the surroundings thereof, and then with this resist layer as a mask, etching the remaining surface emitting laser epitaxial layer 14 using a dry etching method. The resist layer forming method and the dry etching method are the same as for FIG. 11B.

Figure 11D:
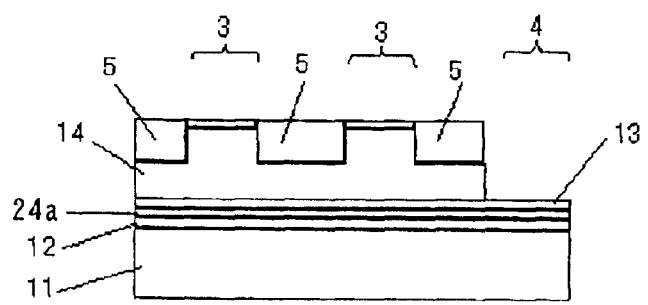

Then, as shown in FIG. 11D, a polyimide insulating layer 5 is formed around the columnar portions 3. Here, after spin coating a photosensitive polyimide precursor on the surface, the upper surface of the columnar portions 3 and the lower surface of the contact holes 4, that is the upper surface of the n contact layer 13, are exposed by a photolithography method, and these are subjected to heat treatment in a nitrogen atmosphere (400° C.) and changed to a polyimide resin. As a result, the polyimide insulating layer 5 is formed so as to fill in around the columnar portions 3.

Figure 12E:
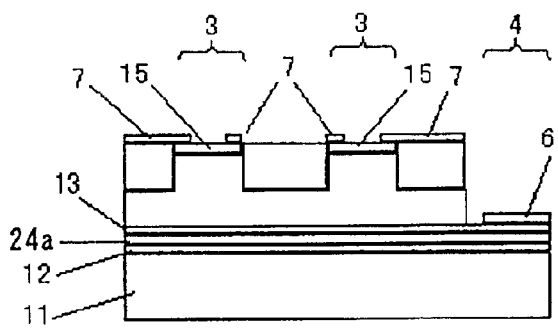
FIG. 12E through FIG. 12H are manufacture explanatory diagrams showing the tenth embodiment of a mountable microstructure according to the present invention.

Then, as shown in FIG. 12E, ring shaped anode electrodes 7 are formed on the p contact layer 15 of the upper surface of the columnar portions 3 and cathode electrodes 6 are formed on the n contact layer 13 inside the contact holes 4. As a result, a surface emitting laser element 2 comprising a pin diode on the columnar portions 3 of the surface emitting laser epitaxial layer 14 is formed. Here the cathode electrode 6 is an AuGe alloy and the anode electrode 7 is an AuZn alloy.

Figure 12F:
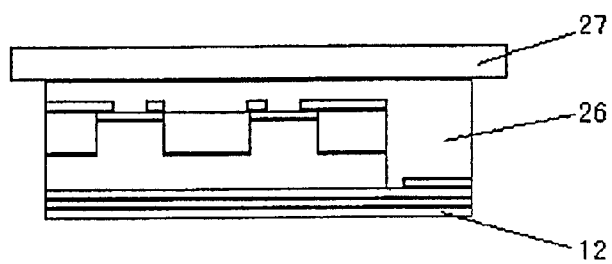

Next, as shown in FIG. 12F, the surface emitting laser element 2 formed on the GaAs substrate 11 is affixed to a holding substrate 27 via an adhesive 26, and the GaAs substrate 11 is removed by selective etching. In the selective etching, an alkali based etchant, for example a mixed liquid of aqua ammonia and hydrogen peroxide solution is used. Since for the etching stop layer 12, the etching rate with respect to these etchants is extremely small, only the GaAs substrate 11 can be etched. Here, for the holding substrate 27, glass is used, however a flexible membrane such as a film may be used.

Figure 12G:
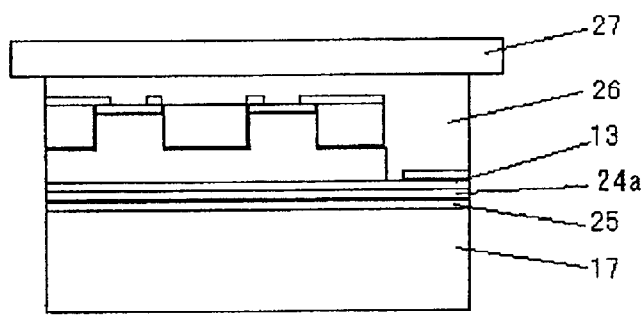

After this, as shown in FIG. 12G, the etching stop layer 12 is removed by for example a buffer hydrofluoric acid to thereby expose the AlGaAs layer 24a, after which an Si substrate 17 with the $SiO_2$ layer 25 formed on the surface is superimposed and clamped. At this time, a dilute hydrofluoric acid solution of 0.1 to 3.0% may be applied to at least one surface. Furthermore, in this condition, it is desirable to apply heating of 70 to 300° C. while applying pressure.

Figure 12H:
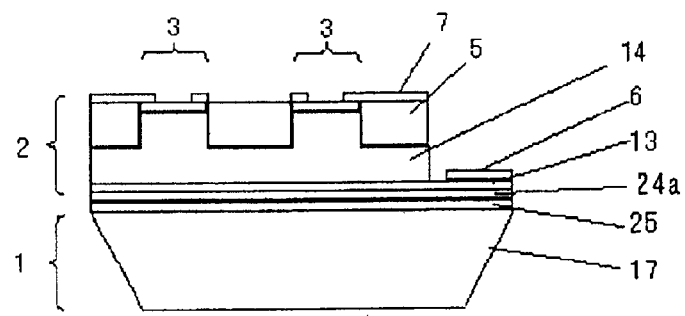

Then finally, as shown in FIG. 12H, the adhesive 26 and the holding substrate 27 are removed, and the Si substrate 17 is anisotropically etched to form the Si block 1 of a shape to engage with the concavities of FIG. 10. As a result, the mountable microstructure comprising the Si block 1 with the surface emitting laser element 2 formed on the upper surface is completed.

Hereunder is a description of two embodiments of an optical transmission apparatus of the present invention.

Figure 13:
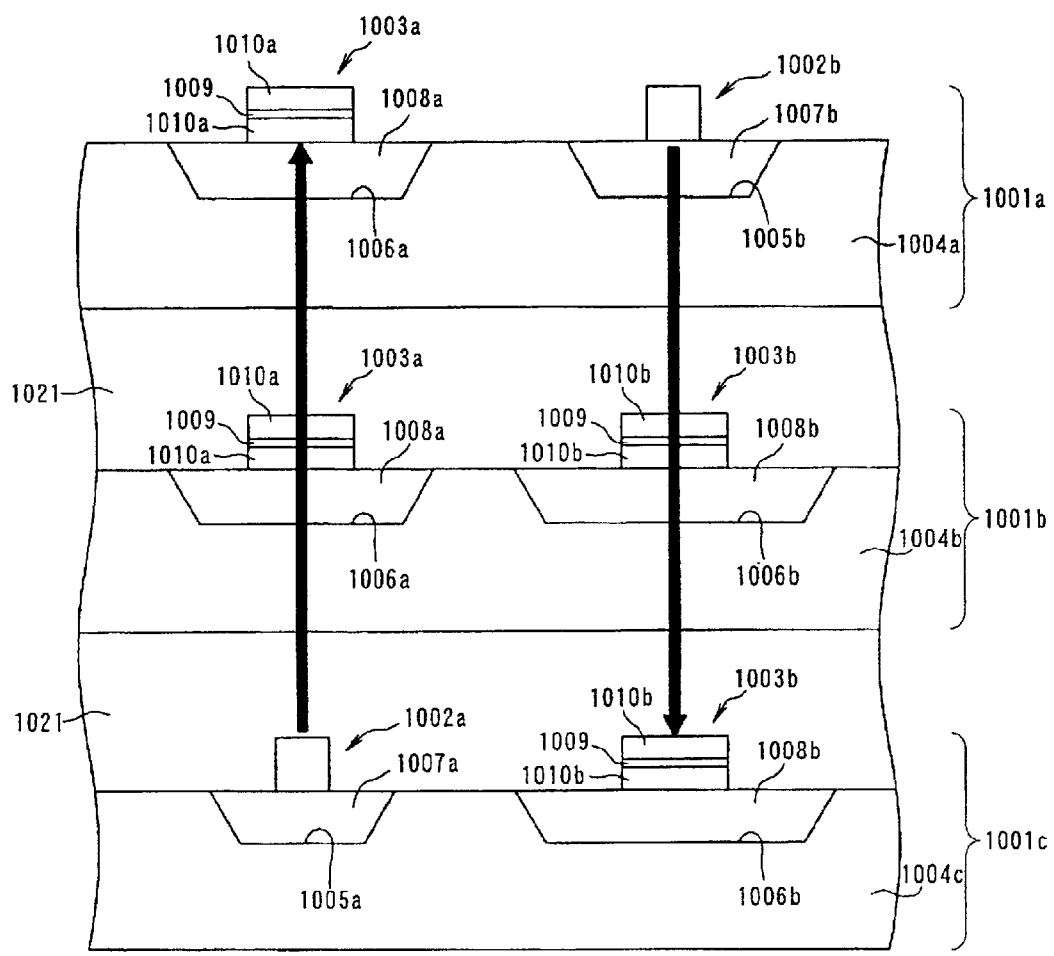
FIG. 13 is a schematic diagram showing a first embodiment of an optical transmission apparatus of the present invention.

FIG. 13 is a schematic diagram of an optical interconnection device between laminated IC chips, being a first embodiment of an optical transmission apparatus of the present invention. Here IC chips (LSI) 1001a to 1001c such as CPUs or DRAMs, are laminated in three layers. In this embodiment, the construction is such that light from a light emitting element 1002a of the IC chip 1c of the lowest layer shown in the figure, is received by light receiving elements 1003a of the IC chips 1001b, 1001a of the middle layer and the uppermost layer, and light of a light emitting element 1002b of the uppermost layer IC chip 1001a is received by light receiving elements 3b of the middle layer and lowermost layer IC chips 1001b, 1001c. Therefore, for the one light emitting element 1002a, the light emitting wavelength is different from that of the other light emitting element 1002b. Furthermore, for the one light receiving element 1003b the sensing light receiving wavelength band is different from that of the other light receiving element 1003b. In this embodiment, substrates (base substances) 1004a to 1004c and microstructures 1007a to 1008b of each of the IC chips 1001a to 1001c are made from Si. Therefore, a wavelength of above 1.0 μm and preferably above 1.1 μm is selected for the light for each light emitting element. Regarding Si, the absorption coefficient is large at approximately 100 $cm^{-1}$ with respect to a wavelength of 1.0 μm and there is a corresponding loss. On the other hand, at a wavelength above 1.1 μm, the absorption co-efficient is small at below 10 $cm^{-1}$. Therefore, in this embodiment, the wavelength of the light of each of the light emitting elements is above 1.0 μm and preferably above 1.1 μm. With light of this wavelength, the Si can easily transmit, and hence the transmission of optical signals between facing light receiving and light emitting elements can be good. Of course, a later mentioned bonding layer 1021 also is transparent with respect to light of this wavelength band.

In the substrates 1004a to 1004c of the respective IC chips 1001a to 1001c, concavities 1005b (1005a), 1006a (1006b) are formed at locations where the light emitting elements 1002*a*, 1002*b* and the light receiving elements 1003*a*, 1003*b* are to be mounted. The concavities 1005*b*, 1006*a* are concavities with the lower face shape smaller than the upper face shape and the side faces of trapezoidal shape. These concavities 1005*b*, 1006*a* can be formed with extremely good accuracy, in particular the inclination and so forth of the side faces, by anisotropic etching the Si. The concavities 1005*b* for the light emitting elements and the concavities 1006*a* for the light receiving elements on at least the same substrate 1004*a* have different shapes such as size. Furthermore, in this embodiment, as shown in FIG. 13, the other concavities, for example the concavity 1006*a*, 1006*b* pairs for the light receiving elements of the substrate 1004*b* of the middle layer IC chip 1001*b*, have a shape such as size different to that of the concavity 1006*b* for the light receiving element and the concavity 1005*a* for the light emitting element of the substrate 1004*c* of the lowermost layer IC chip 1001*c*. That is, for example as with 1006*a* and 1006*b*, the concavity pairs denoted by the same symbols are of the same shape such as size, and the concavity pairs with different symbols are of a different shape such as size to each other. In other words, the concavities of necessary locations for elements of the same function have the same shape, while the concavities for elements of different functions have different shapes.

Figure 14:
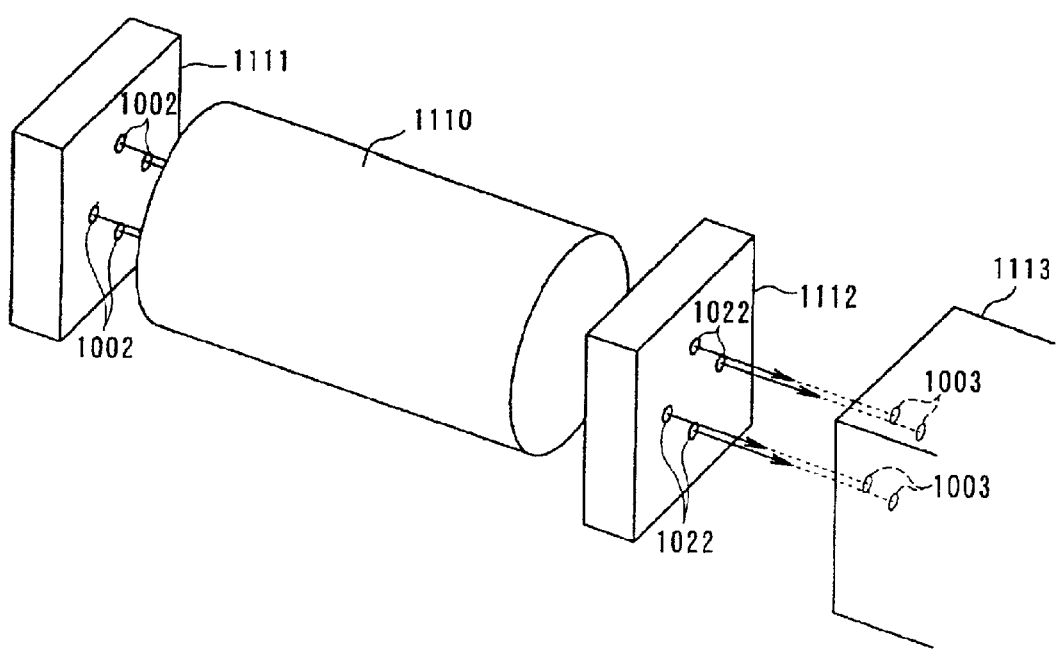
FIG. 14 is a schematic diagram showing a second embodiment of an optical transmission apparatus of the present invention.

Next, a second embodiment is illustrated for where the optical transmission apparatus of the present invention is applied to a wavelength division multiplexed optical interconnection device. The wavelength division multiplexed optical interconnection device is constructed for example as shown in FIG. 14. This example is the same as the device disclosed for example in Japanese Unexamined Patent Application, First Publication No. Hei 11-289317, and comprises: a light emitting element array 1111 in which is mounted a plurality of light emitting elements 2 having different wavelengths, an optical fiber 1110 which becomes an optical waveguide, a filter array 1112 in which is mounted filter elements 1022 for extracting light of each wavelength of the light emitting elements 1002, and a light receiving element array 1113 in which is mounted light receiving elements 1003 for receiving light of each wavelength extracted by the filter array 1112. In this figure, in order to simplify understanding, each of the constituent elements is separated, however in fact each constituent element is optically directly connected.

What is claimed is:

1. A mountable microstructure which is engaged and mounted in a concavity formed at a predetermined location on an upper surface of a base substance, by mixing in a fluid to form a slurry and flowing the slurry over the upper surface of said base substance, wherein there is provided an Si block of a shape for engaging in said concavity on the upper surface of said base substance, and a compound semiconductor element formed on an upper surface of said Si block, wherein a current blocking layer using a PN connection is provided between a compound semiconductor element electrode formed on the upper surface of said Si block and said Si block.

2. A mountable microstructure according to claim 1, wherein said Si block and said compound semiconductor element are bonded by a compound semiconductor-Si direct bonding.

3. A mountable microstructure according to claim 1, wherein said Si block and said compound semiconductor element are bonded by an InP—Si direct bonding.

4. A mountable microstructure according to claim 1, wherein said Si block and said compound semiconductor element are bonded by a GaAs—Si direct bonding.

5. A mountable microstructure according to claim 1, wherein said Si block and said compound semiconductor element are bonded via a metal film.

6. A mountable microstructure according to claim 1, wherein said Si block and said compound semi conductor element are bonded via solder.

7. A mountable microstructure according to claim 1, wherein said Si block and said compound semiconductor element are bonded via resin.

8. A mountable microstructure according to claim 1, wherein said Si block and said compound semiconductor element are bonded via an $SiO_2$ film.

9. A mountable microstructure according to claim 1, wherein said I block and said compound semiconductor element are bonded via an $SiO_2$ film and an AlGaAs layer.

10. A mountable microstructure according to claim 1, wherein a plurality of said compound semiconductor elements are formed on each Si block.

11. A mountable microstructure which is engaged and mounted in a concavity formed at a predetermined location on an upper surface of a base substance, by mixing in a fluid to form a slurry and flowing the slurry over the upper surface of said base substance, wherein there is provided an Si block of a shape for engaging in said concavity on the upper surface of said base substance, and a compound semiconductor element formed on an upper surface of said Si block;

wherein individual elements are formed on said Si block itself;

said individual elements formed on said Si block itself and said compound semiconductor element are arranged so as to overlap or face each other; and a current blocking layer using a PN connection is provided between a compound semiconductor element electrode formed on the upper surface of said Si block and said Si block.

12. A mountable microstructure which is engaged and mounted in a concavity formed at a predetermined location on an upper surface of a base substance, by mixing in a fluid to form a slurry and flowing the slurry over the upper surface of said base substance, wherein there is provided an Si block of a shape for engaging in said concavity on the upper surface of said base substance, and a compound semiconductor element formed on an upper surface of said Si block;

wherein individual elements are formed on said Si block itself;

said individual elements formed on said Si block itself and said compound semiconductor element are arranged so as to be displaced from each other; and a current blocking layer using a PN connection is provided between a compound semiconductor element electrode formed on the upper surface of said Si block and said Si block.

13. A mountable microstructure which is engaged and mounted in a concavity formed at a predetermined location on an upper surface of a base substance, by mixing in a fluid to form a slurry and flowing the slurry over the upper surface of said base substance, wherein there is provided an Si block of a shape for engaging in said concavity on the upper surface of said base substance, and a compound semiconductor element formed on an upper surface of said Si block; and wherein all of the electrodes for said compound semiconductor element are formed on the upper surface of said Si block; and a current blocking layer using a PN connection is provided between said compound semiconductor element electrode formed on the upper surface of said Si block and said Si block.

14. A mountable microstructure which is engaged and mounted in a concavity formed at a predetermined location on an upper surface of a base substance, by mixing in a fluid to form a slurry and flowing the slurry over the upper surface of said base substance, wherein there is provided an Si block of a shape for engaging in said concavity on the upper surface of said base substance, and a compound semiconductor element formed on an upper surface of said Si block;
   wherein any one of the electrodes for said compound semiconductor element is made common with the electrodes for said Si block; and
   a current blocking layer using a PN connection is provided between said compound semiconductor element electrode formed on the upper surface of said Si block and said Si block.

15. A mountable microstructure according to claim 14, wherein a high resistance layer with a resistance greater than $1 \times 10^4$ Ω is provided between said compound semiconductor element electrode and said Si block.

16. A mountable microstructure according to claim 15, wherein said high resistance layer comprises a compound semiconductor.

17. A mountable microstructure according to claim 15, wherein said high resistance layer comprises a compound semiconductor doped with Cr and O.

18. A mountable microstructure according to claim 15, wherein said high resistance layer comprises an oxide.

19. A mountable microstructure according to claim 15, wherein said high resistance layer comprises a nitride.

20. A mountable microstructure according to claim 15, wherein said high resistance layer comprises a resin.

21. A mountable microstructure according to claim 14, wherein said current blocking layer is formed by laminating layers of a P-type semiconductor and an N-type semiconductor in PNP or NPN order.

22. A mountable microstructure according to claim 21, wherein a contact layer in the immediate vicinity of said Si block is used as the P-type semiconductor or the N-type semiconductor constituting said current blocking layer.

23. An optical transmission apparatus comprising:
   a first base substance with a first mountable microstructure which is engaged and mounted in a concavity formed at a predetermined location on an upper surface of the first base substance, by mixing in a fluid to form a slurry and flowing the slurry over the upper surface of said first base substance, wherein there is provided a Si block of a shape for engaging in said concavity on the upper surface of said first base substance, and a compound semiconductor element formed on an upper surface of said Si block, the first base substance including a light emitting element mounted in the concavity, and
   a second base substance with a second mountable microstructure which is engaged and mounted in a concavity formed at a predetermined location on an upper surface of the second base substance, by mixing in a fluid to form a slurry and flowing the slurry over the upper surface of said second base substance, wherein there is provided a Si block of a shape for engaging in said concavity on the upper surface of said second base substance, and a compound semiconductor element formed on an upper surface of said Si block, which includes the second base substance including a light receiving element mounted in the concavity,
   wherein the first base substance and the second base substance are laminated so that said light emitting element and said light receiving element face each other.

24. An optical transmission apparatus having a light emitting section comprising:
   a first base substance with a mountable microstructure which is engaged and mounted in a concavity formed at a predetermined location on an upper surface of the first base substance, by mixing in a fluid to form a slurry and flowing the slurry over the upper surface of said first base substance, wherein there is provided a Si block of a shape for engaging in said concavity on the upper surface of said first base substance, and a compound semiconductor element formed on an upper surface of said Si block, and a light emitting element mounted in the concavity, and
   a light receiving section comprising:
      a second base substance with a mountable microstructure which is engaged and mounted in a concavity formed at a predetermined location on an upper surface of the second base substance, by mixing in a fluid to form a slurry and flowing the slurry over the upper surface of said second base substance, wherein there is provided a Si block of a shape for engaging in said concavity on the upper surface of said second base substance, and a compound semiconductor element formed on an upper surface of said Si block, and a light receiving element mounted in the concavity wherein the first base substance and the second base substance are laminated so that said light emitting element and said light receiving element face each other.

* * * * *